United States Patent
Keal (10) Patent No.: US 10,514,774 B1
(45) Date of Patent: Dec. 24, 2019

(54) SYSTEM AND METHOD FOR DETERMINING ORIENTATION OF A DEVICE

(71) Applicant: INVENSENSE, INC., San Jose, CA (US)

(72) Inventor: William Kerry Keal, Santa Clara, CA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 14/709,423

(22) Filed: May 11, 2015

(51) Int. Cl.
| G06F 3/0346 | (2013.01) |
| G01C 19/02 | (2006.01) |
| G01P 15/14 | (2013.01) |
| G01D 5/12 | (2006.01) |
| G01R 31/367 | (2019.01) |

(52) U.S. Cl.
CPC .......... *G06F 3/0346* (2013.01); *G01C 19/02* (2013.01); *G01D 5/12* (2013.01); *G01P 15/14* (2013.01); *G01R 31/367* (2019.01)

(58) Field of Classification Search
None
See application file for complete search history.

(56) References Cited

U.S. PATENT DOCUMENTS

| 2008/0119273 A1* | 5/2008 | Yamada | G06F 1/3215 463/39 |
| 2010/0013860 A1* | 1/2010 | Mandella | G01B 21/04 345/650 |
| 2012/0086725 A1* | 4/2012 | Joseph | G06F 3/038 345/629 |
| 2016/0282949 A1* | 9/2016 | Midholt | G06F 3/017 |

\* cited by examiner

*Primary Examiner* — Amare Mengistu
*Assistant Examiner* — Sarvesh J Nadkarni
(74) *Attorney, Agent, or Firm* — Minisandram Law Firm; Raghunath S. Minisandram (57) ABSTRACT

A method and system to a system to determine orientation of a device is disclosed. At least one sensor is provided. A quaternion is generated based on a signal generated by the sensor. The quaternion is indicative of the orientation of the device with reference to a stationary frame. Elements of the quaternion are compared to at least one predefined threshold value. A second signal is generated if the comparison is within the predefined threshold value.

30 Claims, 9 Drawing Sheets

SYSTEM AND METHOD FOR DETERMINING ORIENTATION OF A DEVICE

TECHNICAL FIELD

The present invention relates generally to microelectromechanical systems (MEMS) device and more particularly, to MEMS devices with one or more sensors.

DESCRIPTION OF RELATED ART

MEMS devices are formed using various semiconductor manufacturing processes. MEMS devices may have fixed and movable portions. MEMS force sensors have one or more sense material, which react to an external influence imparting a force onto the movable portions. The sense material can be the MEMS structural layer or a deposited layer. The MEMS force sensor may be configured to measure these movements induced by the external influence to determine the type and extent of the external influence.

Output of MEMS devices is provided to a host device, for further use. In some examples, output of MEMS devices may be a signal indicative of an orientation of the host device. One or more applications running on the host device may use the signal indicative of the orientation of the host device. In some examples, the applications may display the orientation of the host device on a display device. For example, a map application may use the signal indicative of the orientation to display a map on a display that corresponds to the orientation of the host device. In some examples, the applications may use the orientation of the device to perform one or more actions. The actions may be performed when a certain static orientation is detected, or when certain dynamic orientation changes, such as gestures, are detected. As one skilled in the art appreciates, orientation of the host device may change rapidly and change to the signal indicative of the orientation of the device may need to be processed timely to permit an application to use the signal indicative of the orientation of the device. In some examples, a change in the signal indicative of the orientation of the device may be used by an application to take one or more actions. It may be desirable to simplify the calculation of signal indicative of orientation of the host device or signal indicative of a change in orientation of the host device. Simplifying the calculation may save processing power, and therefore battery power, and may increase reactivity of the system.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method for determining orientation of a device is disclosed. At least one sensor is provided, the sensor generating a signal. A quaternion is generated based on the signal, the quaternion indicative of an orientation of the device with reference to a stationary frame. Elements of the quaternion are compared to at least one predefined threshold value. A second signal is generated if the comparison is within the predefined threshold value.

In yet another embodiment, a system to determine orientation of a device is disclosed. The system includes at least one sensor, a signal generated by the sensor. A quaternion is generated based on the signal, the quaternion indicative of an orientation of the device with reference to a stationary frame. Elements of the quaternion are compared to at least one predetermined threshold value and a second signal is generated if the comparison is within the predefined threshold value.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures.

DETAILED DESCRIPTION

To facilitate an understanding of the adaptive aspects of the present disclosure, an exemplary system and method for determining orientation of a host device is described. The specific construction and operation of the adaptive aspects of the system and method for determining orientation of the host device are described with reference to an exemplary host device.

Figure 1:
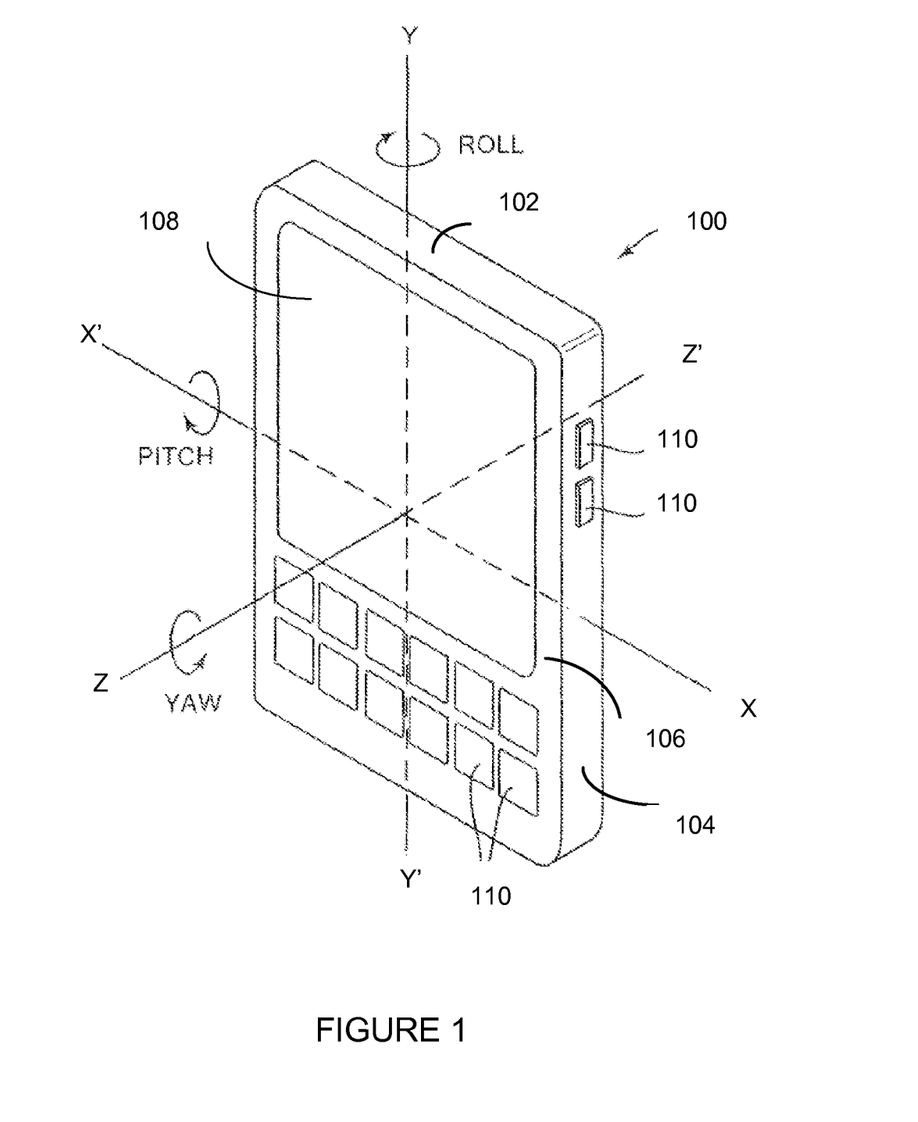
FIG. 1 shows a host device, with various axes of the device frame, according to one aspect of the present disclosure.

FIG. 1 shows a host device 100, in accordance with an embodiment of this disclosure. The orientation of the host device 100 is defined using a device frame defined by a first side 102, a second side 104 and a third side 106 of the device. As one skilled in the art appreciates, the first side 102, second side 104 and third side 106 are substantially orthogonal to each other. In one example, the host device 100 may be a mobile device, with a display screen 108 disposed over the third side 106. In some examples, the host device 100 may further include one or more input devices, for example, one or more buttons 110. As one skilled in the art appreciates, the host device 100 may be a computing device. In some examples, the host device may be a general purpose computing device. In yet another example, the host device may be a special purpose computing device. For example, the host device may be a cell phone, a watch, a gaming device, a navigation device and the likes. FIG. 1 may represent a smartphone, but may also represent a smartwatch where the bracelet has been omitted in the drawing.

In one example, an X-axis of the device frame may be defined by a line X-X' running substantially parallel to the first side 102 and substantially perpendicular to the second side 104. Similarly, a Y-axis of the device frame may be defined by a line Y-Y' running substantially parallel to the second side 104 and substantially perpendicular to the first side 102. A Z-axis of the device frame may be defined by a line Z-Z', orthogonal to both the X-axis and the Y-axis, and substantially orthogonal to the third side 106. As one skilled in the art appreciates, rotation along the X-axis may be sometimes referred to as a pitch, rotation along the Y-axis may be sometimes referred to as a roll and rotation along the Z-axis may be sometimes referred to as yaw.

Figure 2:
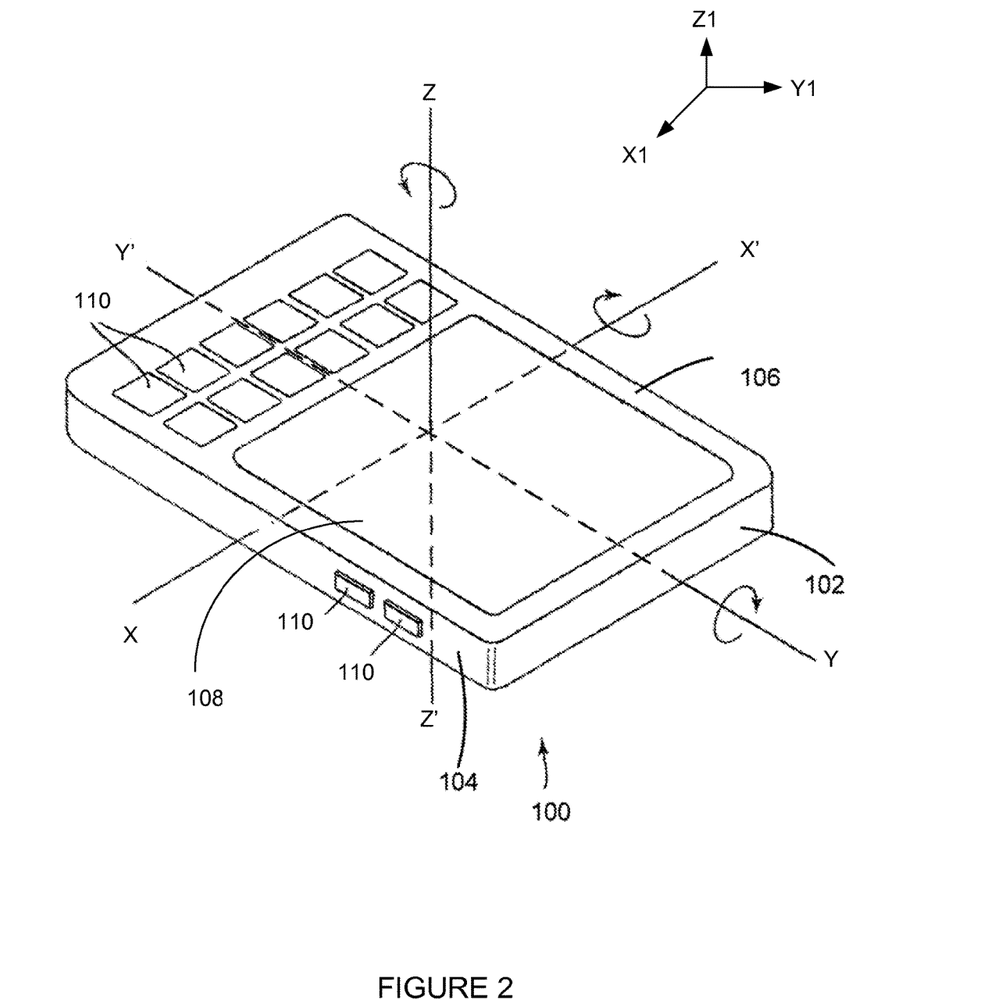
FIG. 2 shows an orientation of the host device, with reference to a stationary frame, according to one aspect of the present disclosure.

Now, referring to FIG. 2, an example orientation of the host device 100 with reference to a stationary frame will be described. In this example, a stationary reference frame with orthogonal axes X1, Y1, Z1 is defined. This reference frame is independent of the orientation of the host device 100. In some examples, one or more axes of the reference frame may correspond to a known orientation. For example, in some examples, the Z1 axis of the reference frame may correspond to earth's gravitational force axis. In another example, the X1 or Y1 axis may correspond to an orientation of the earth's magnetic field, e.g. North. In the example of FIG. 2, the Z axis of the host device 100 is aligned with the Z1 axis of the stationary frame. Host device 100 may be rotated, which changes the alignment between the axes of the device frame and the axes of the stationary frame. As one skilled in the art appreciates, the orientation of the host device is defined as the orientation of the axes of the device frame with respect to the axes of the stationary frame. For example, the orientation may be expressed using Euler angles, rotation matrices, or quaternions. The orientation may be thought of in terms of rotations because the orientation describes how to rotate the host device 100 so that the axes of the device frame are aligned with the axes of the stationary frame.

One or more sensors embedded in the host device 100 may provide signals to determine the orientation of the host device with reference to the stationary frame of reference. Now, referring to FIG. 3, an example system 300 with a plurality of sensors will be described. System 300 includes a plurality of sensors 302a, 302b and 302c. In one example, sensor 302a is a gyroscope, sensor 302b is an accelerometer, and sensor 302c is a magnetometer. The system further includes an orientation module 306 and a decision logic 312.

Figure 3:
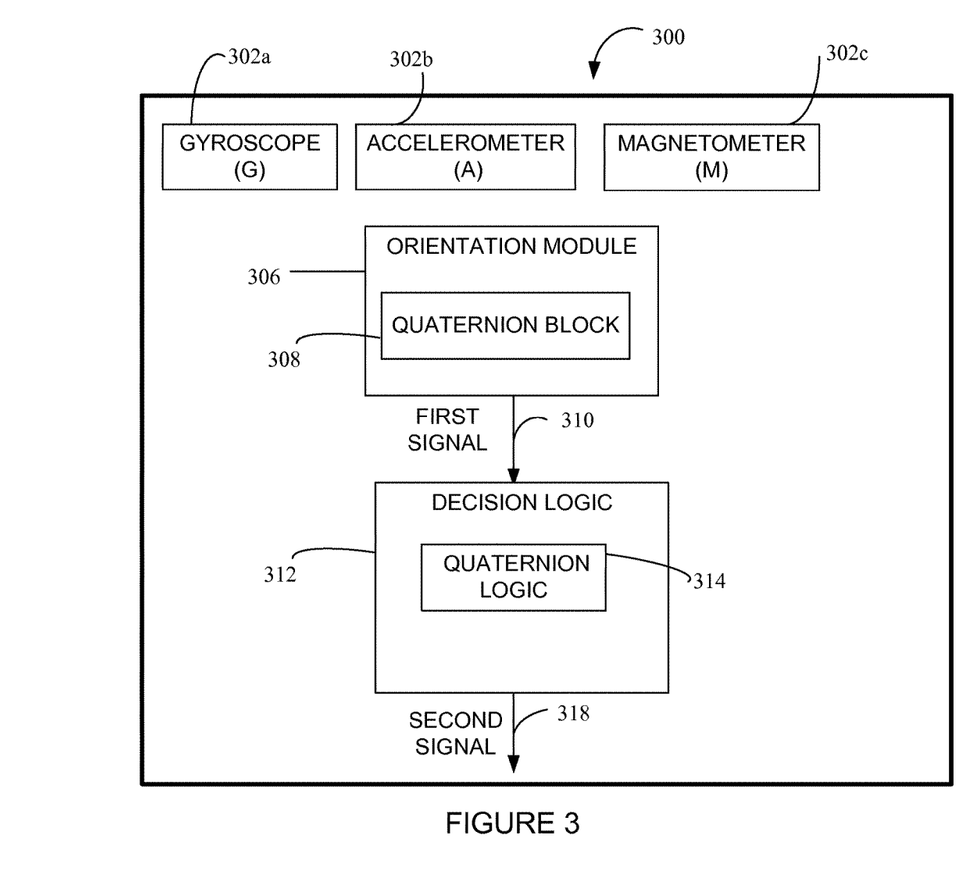
FIG. 3 shows a block diagram of a system with a plurality of sensors, according to one aspect of the present disclosure.

Orientation module 306 is configured to receive output of one or more sensors, 302a, 302b and 302c, and use the output to generate a first signal 310 indicative of the orientation of the device with reference to the stationary frame. For example, quaternion block 308 may be used to generate the first signal 310. First signal 310 is then fed to the decision logic 312, which includes a quaternion logic 314. Functions and features of the quaternion logic 314 will be later described in detail. Based on the operations of the quaternion logic 314, a second signal 318 is generated. The second signal 318 in one example may indicate a orientation of the host device. In some examples, the second signal 318 may indicate if the host device is in a predetermined orientation, or if the host device has been in a predetermined orientation for a certain amount of time. In some examples, the second signal 318 may indicate if the host device experienced a certain gesture, for example, a change in orientation from a first predetermined orientation to a second predetermined orientation. In some examples, the second signal 318 may be an interrupt signal. The second signal 318 may be used to trigger a certain application (software or hardware), or a certain function in an application.

Various sensors for example, gyroscope 302a, accelerometer 302b and magnetometer 302c provide raw data indicative of orientation. As one skilled in the art appreciates, each sensor may have 3 axes, which may be aligned with the axes of the device frame. If the sensors are not perfectly aligned with the axes of the device, small corrections may be performed so that the 3 axes of sensor output signals correspond the orthogonal axes of the device. The sensor signals for the various axes of the device frame are used by the orientation module 306 to calculate the orientation of the host device 100 with respect to the stationary frame.

The combination of the different sensor signals is often referred to as sensor fusion. For example, the accelerometer measures the acceleration on the different axes of the device frame, from which the orientation of the host device with respect to gravity can be determined. In a similar manner, the orientation of the host device with respect to the earth's magnetic field can be determined using the magnetometer signals. In addition, the gyroscope measures the angular rotation rate of the host device over the different axes of the device frame. By integrating the gyroscope signals on the different axes, the rotational angles over the different axis of the host device 100 can be calculated, from which a change in orientation can be deduced. The fusion of the information from the different sensors gives the complete orientation of the host device with respect to the stationary frame. Depending on the available sensors, sometimes the complete orientation in three dimensions may not be known, for example if only an accelerometer is available. In this case, only the orientation of the device with respect to gravity may be determined, and thus the first signal 310 may represent the partial orientation with respect to gravity. For some applications, there is no need to know the complete orientation in three dimensions. For some applications, the partial orientation is sufficient, such as e.g. the orientation with respect to gravity, North, or any other predefined orientation. In this disclosure we will use the term orientation, but this can mean a full or a partial orientation.

The details of the calculation of the orientation of the device in the stationary frame, i.e. the details of the sensor fusion, depend on the sensors that are available and on the quality and accuracy of the signals. The signals of the different sensors may be given a weight to determine to what extent they contribute to the fusion, or some sensor signals may even not be used at all. For example, the magnetometer signals may be given a low weight or may not be used because of magnetic perturbations. In another example, the accelerometer signals may be given a low weight or may not be used because of proper acceleration of the device that cannot be neglected compared to the acceleration due to gravity. The gyroscope signals can be used to determine the change in orientation in the absence of any other useable sensor signals, once a correct reference orientation has been determined, e.g. with the help of other sensors.

Figure 3A:
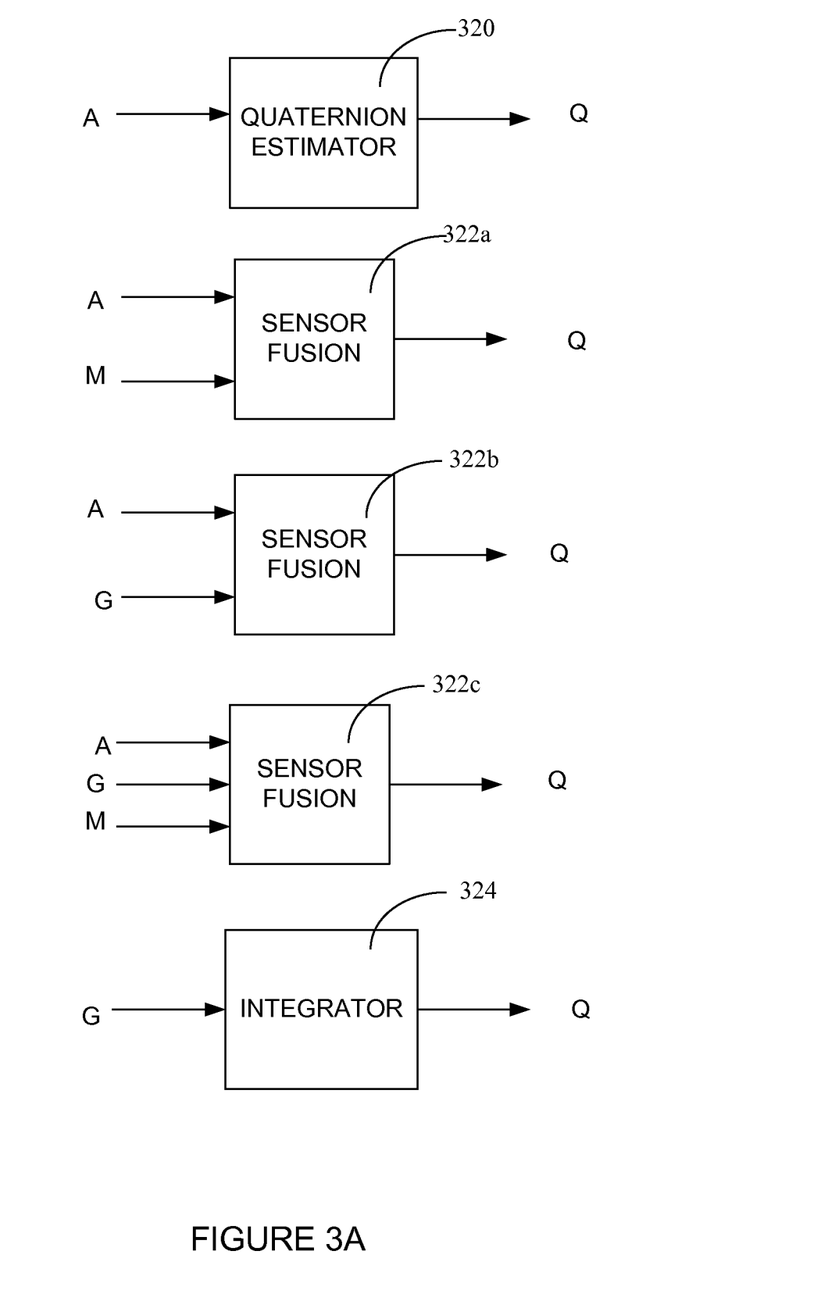
FIG. 3A shows various combinations of processing signals from the plurality of sensors of FIG. 3.

FIG. 3A shows various combinations of sensor outputs that may be used to calculate an orientation. Quaternion estimator 320 receives accelerometer (A) output as input and outputs orientation Q as output. The sensor fusion 322a receives accelerometer (A) output and Magnetometer (M) output as inputs and outputs orientation Q as output. The sensor fusion 322b receives accelerometer (A) output and gyroscope (G) output as inputs and outputs orientation Q as output. The sensor fusion 322c receives accelerometer (A) output, compass (C) output and Gyroscope output as inputs and outputs orientation Q as output. The integrator 324 receives gyroscope (G) output as input and outputs orientation Q as output. The integrator 324 may also receive a previous orientation as an input, and add the change of orientation determined using the gyroscope (G) to calculate the new orientation Q. In some examples, sensor fusion 322a, 322b and 322c may be same, with a selective switch that selectively inputs one or more of the inputs. In some examples, the inputs of the sensor signals of the sensor fusion 322a, 322b and 322c may have different weights. The Quaternion estimator 320, sensor fusion 322a-322c and integrator 324 may be implemented in the orientation module 306. For example, quaternion estimator 320, sensor fusion 322a-322c and integrator 324 may be implemented in the quaternion block 308. In one example, the output Q may be a quaternion, which will be further described in detail. In other examples, the output Q may be described using e.g. Euler angles or rotation matrices. In this case, the Quaternion block 308 will be replaced by an equivalent block.

The orientation of the host device with respect to the stationary frame as calculated by the orientation module 306 may be expressed in different forms as discussed above. For example, if well-known Euler angles are used, the orientation will be described by subsequent rotations over the yaw axis, the pitch axis and the roll-axis. Alternatively, instead of performing 3 sequential rotations, quaternion techniques may be used to express the orientation as a single rotation. As an example, the use of quaternions in the orientation module 306 to determine the first signal 310 representative of the orientation of the device in the stationary frame will now be discussed. For example, a quaternion block 308 may perform quaternion transformations as described below to perform the calculation and representation of the orientation.

A unit quaternion, also referred to as quaternion, is a 4-element vector that describes how to go from a first orientation to a second orientation using a single rotation over a unit vector. In this example, the quaternion rotation expresses the orientation of the host device as a rotation of the host device that would align the axes of the device frame with the axes of the stationary frame (as discussed above). Quaternion and unit quaternion are used interchangeable in this document. A unit quaternion has a scalar term and 3 imaginary terms. In this disclosure, the scalar term is indicated first followed by the imaginary term. In equation 1, for a quaternion, the angle θ is the amount rotated about the unit vector, $[u_x, u_y, u_z]$.

$$\overline{Q} = \begin{bmatrix} \cos\left(\frac{\theta}{2}\right) \\ \sin\left(\frac{\theta}{2}\right) \cdot u_x \\ \sin\left(\frac{\theta}{2}\right) \cdot u_y \\ \sin\left(\frac{\theta}{2}\right) \cdot u_z \end{bmatrix} \qquad \text{Equation 1}$$

A quaternion multiplication is defined in Equation 2. The "⊗" will represent quaternion multiplication in this document.

$$\overline{Q_2} = \begin{bmatrix} q_{2w} \\ q_{2x} \\ q_{2y} \\ q_{2z} \end{bmatrix} \qquad \text{Equation 2}$$

$$\overline{Q_1} \otimes \overline{Q_2} = \begin{bmatrix} q_{1w} \cdot q_{2w} - q_{1x} \cdot q_{2x} - q_{1y} \cdot q_{2y} - q_{1z} \cdot q_{2z} \\ q_{1w} \cdot q_{2x} + q_{1x} \cdot q_{2w} + q_{1y} \cdot q_{2z} - q_{1z} \cdot q_{2y} \\ q_{1w} \cdot q_{2y} - q_{1x} \cdot q_{2z} + q_{1y} \cdot q_{2w} + q_{1z} \cdot q_{2x} \\ q_{1w} \cdot q_{2z} + q_{1x} \cdot q_{2y} - q_{1y} \cdot q_{2x} + q_{1z} \cdot q_{2w} \end{bmatrix}$$

A quaternion inverse is defined in Equation 3.

$$\overline{Q_1'} = \begin{bmatrix} q_{1w} \\ -q_{1x} \\ -q_{1y} \\ -q_{1z} \end{bmatrix} \qquad \text{Equation 3}$$

Given angular velocity in radians/second in Equation 4, with magnitude $\omega_m$ shown in Equation 5, with a gyroscope data $[\omega_x, \omega_y, \omega_z]$ sampled with timesteps of t, a quaternion can be defined as described below with reference to Equation 6:

$$\omega_m = [\omega_x, \omega_y, \omega_z] \qquad \text{Equation 4}$$

$$\omega_m = \sqrt{\omega_x \cdot \omega_x + \omega_y \cdot \omega_y + \omega_z \cdot \omega_z} \qquad \text{Equation 5}$$

$$\overline{Q_w} = \begin{bmatrix} \cos\left(\omega_m \cdot \frac{t}{2}\right) \\ \frac{\omega_x}{\omega_m} \cdot \sin\left(\omega_m \cdot \frac{t}{2}\right) \\ \frac{\omega_y}{\omega_m} \cdot \sin\left(\omega_m \cdot \frac{t}{2}\right) \\ \frac{\omega_z}{\omega_m} \cdot \sin\left(\omega_m \cdot \frac{t}{2}\right) \end{bmatrix} \qquad \text{Equation 6}$$

Then the quaternion update equation that describes how to go from a first orientation $Q_N$ to a second orientation $Q_{N+1}$ would be, as shown below in Equation 7:

$$Q_{N+1} = Q_N \otimes Q_w \qquad \text{Equation 7}$$

For small updates, i.e. small rotation angles, Equation 7 can be rewritten using Taylor approximations for the sine and cosine as shown below in Equation 8:

$$\overline{Q_{N+1}} = \overline{Q_N} + \frac{t}{2} \cdot \overline{Q_N} \otimes \begin{bmatrix} 0 \\ w_0 \\ w_1 \\ w_2 \end{bmatrix} \qquad \text{Equation 8}$$

$$\overline{Q_{N+1}} = \frac{\overline{Q_{N+1}}}{\|\overline{Q_{N+1}}\|}$$

In Equation 8, previous quaternion is multiplied by the rotation rate from the gyroscope (in radians) using a quaternion multiply. This is scaled by the time between samples over 2 and added to the previous quaternion. Next, the quaternion is divided by the magnitude to maintain a magnitude of 1.

Figure 4A:
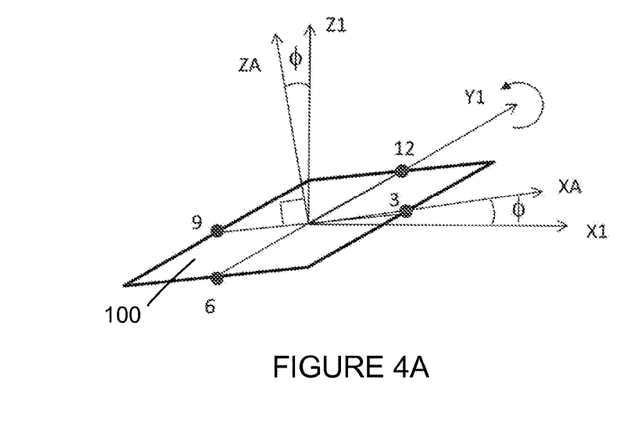
FIGS. 4A-4D show orientation of host device with reference to a stationary frame, according to one aspect of the present disclosure.

In some examples, it may be desirable to have the host device in a predefined orientation. For example, the host device may be a watch and the watch may be configured to activate the display e.g. to show the time, only when the watch is held in a predefined orientation. This helps to save energy by switching off the display when the user is not looking at the display. Now, referring to FIG. 4A, the example host device 100 may be a watch. The device frame of the watch has a orientation corresponding to three orthogonal axes XA, YA and ZA, where the XA axes corresponds to the 3 o'clock direction, the YA axis corresponds to the 12 o'clock directions, and the ZA axis is perpendicular to the display. The stationary frame is defined by three orthogonal axes X1, Y1 and Z1. In this example, the X1 and Y1 axes correspond to a plane substantially parallel to a ground plane and the Z1 axis corresponds to gravity. FIG. 4A shows the watch has been rotated along the YA axis, so that the XA makes an angle $\phi$ with the X1 axis. Because this is the only rotation, the YA axis coincides with the Y1 axis, and the ZA axis also makes an angle $\phi$ with the Z1 axis. If we assume that the user is in a normal straight position (standing or sitting, rather than lying), the angle between axis X1 and XA, i.e. angle $\phi$, should not be too big (in either direction) so that the user can easily look at the display. Therefore, we can say that the angle $\phi$ should be below a threshold. If the angle is above the threshold, the user cannot (easily) look at the display, so the display does not have to be activated. As an example, if the orientation of the device is represented as a quaternion Q, this requirement may be represented as follows:

$$\|\sin(\phi)\| = \|2 \cdot q_x \cdot q_z - 2 \cdot q_w \cdot q_y\| < T_1 \qquad \text{Equation 9}$$

The quaternion elements are $q_w$, $q_x$, $q_y$, and $q_z$ and correspond to the scalar term and 3 imaginary terms respectively, as previously described with reference to Equation 1. The threshold value $T_1$ defines the preferred range for the sine of angle $\phi$. As one skilled in the art appreciates, the multiplier of 2 in Equation 9 may be eliminated by dividing the desired threshold value by 2. In some examples, this may be desirable, as one multiplication operation is reduced during computation. The threshold T1 can also be converted to represent the range of angle $\phi$ instead of the range of the sine of angle $\phi$. However, this would mean we need to take the arcsine to the quaternion elements, which may add additional computations.

Figure 4B:
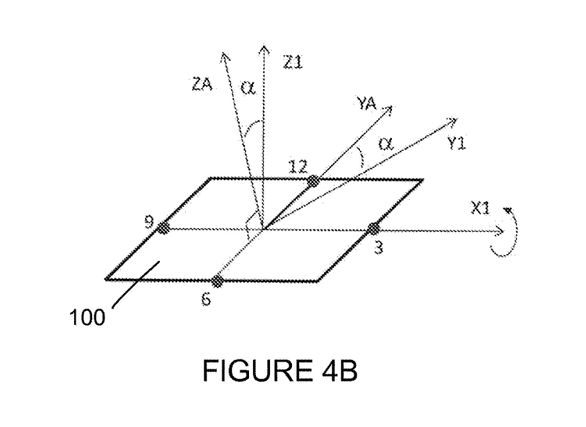

Similarly, FIG. 4B shows the watch has been rotated along the XA axis, so that the YA makes on angle $\alpha$ with the Y1 axis. Because this is the only rotation, the ZA also makes an angle $\alpha$ with the Z1 axis. If we assume that the user is in a normal straight position (standing or sitting, rather than lying), the angle between axis Y1 and YA, i.e. angle $\alpha$, should be large enough so that the display is facing the user and the user can easily look at the display. For example, this requirement may be represented as follows:

$$\sin(\alpha) = 2 \cdot q_w \cdot q_x - 2 \cdot q_y \cdot q_z > T_2 \qquad \text{Equation 10}$$

The quaternion elements are $q_w$, $q_x$, $q_y$, and $q_z$ and correspond to the scalar term and 3 imaginary terms respectively, as previously described with reference to Equation 1 and 9. The threshold value $T_2$ defines the preferred range for the sine of angle $\alpha$. As one skilled in the art appreciates, the multiplier of 2 in Equation 10 may be eliminated by dividing the desired threshold value by 2. In some examples, this may be desirable, as one multiplication operation is reduced during computation. Similarly as with threshold $T_1$, the threshold $T_2$ can also be converted to represent the range of angle $\alpha$ instead of the range of sine of angle $\alpha$. However, this would mean we need to take the arcsine to the quaternion elements, which may add additional computations.

Figure 4C:
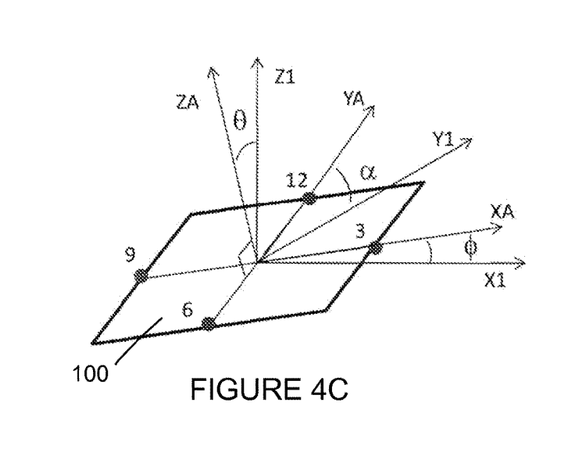

FIG. 4C shows a situation where the host device is rotated over the XA axis and the YA axis. This results in an angle $\theta$ between the ZA and Z1 axis. In analogy with equation 9 and 10, the cosine of the angle $\theta$ is represented as follows:

$$\cos(\theta) = 2 \cdot q_w^2 + 2 \cdot q_z^2 - 1 \qquad \text{Equation 11}$$

It may be desirable to have the angle $\theta$ within a range, for example, within a threshold value of $T_3$ and $T_4$. For example, this requirement may be represented as follows:

$$T_3 < 2 \cdot q_w^2 + 2 \cdot q_z^2 - 1 < T_4 \qquad \text{Equation 12}$$

As previously described, the Equation 12 may be simplified (for example, eliminating multiplier of 2 and the subtraction of 1, and adjusting the threshold value $T_3$ and $T_4$ accordingly.

Equation 9, Equation 10, and Equation 11 may all be used to verify if the orientation of the host device is according to preset rules and the corresponding thresholds. In one example, the equations may be performed by the quaternion logic block 314 in the decision logic module 312. The decision logic 312 may be used to compare the output of the quaternion multiplications with a threshold value to determine if they meet a predefined threshold value. Based on the analysis, the decision logic 312 may generate the second signal 318. The quaternion logic 314 and the decision logic 312 may use only one of the above equations, or may use a combination of two or all three equations. The first signal may correspond to the quaternion components used in the equations. In one example, the orientation that fulfills one or more of the equations in the decision logic 312, may correspond to a condition where the display should be activated, e.g. to show the time. When the orientation corresponds to these conditions, the second signal 318 may correspond to the signal to activate the display.

In some examples, the display may be in an inactive state and the second signal 318 may be selectively used to switch the display from the inactive state to active state. In some examples, the display may be in an active state and when the orientation of the device changes, for example, when the elements of the quaternion meet a different threshold value, it may be desirable to change the display from the active state to inactive state. In such an example, the second signal 318 may be selectively used to switch the display from the active state to an inactive state.

Figure 4D:
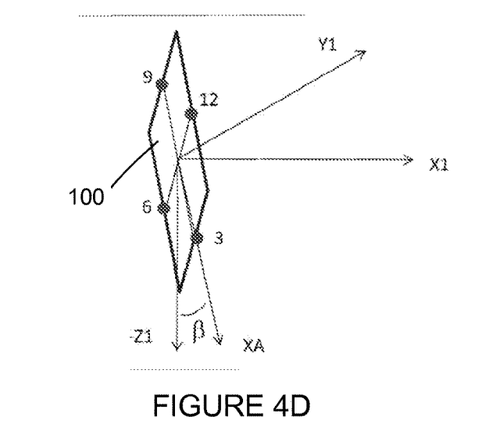

In the examples above, the equations were used to determine if the host device was in a position typically corresponding to facing the user. However, in some examples, it may be desirable to know if the host device is in a position that may be referred to as down. In other words, if the hand of the user to which the host device is attached or which is holding the device is down. As previously described, the XA body axis corresponds to the 3 o'clock axis. If the hand of the user is substantially down, the XA body axis would be close to parallel to the −Z1 axis (in other words, close to the gravity axis). FIG. 4D shows the XA axis forms an angle of $\beta$, with reference to the Z1 axis. Because the angle with the X1 or Y1 is irrelevant, the XA axis actually forms a cone around the −Z1 axis, with a cone angle of $\beta$. So, the equation to determine if the axis XA that corresponds to 3 o'clock is down within this cone is:

$$-\cos(\beta) = 2 \cdot q_x \cdot q_z - 2 \cdot q_w \cdot q_y < -T_5 \qquad \text{Equation 13}$$

In Equation 13, $T_5$ is a threshold value for the cone angle of $\beta$. As one skilled in the art appreciates, the threshold value may be converted as discussed above, e.g. the multiplier of 2 in Equation 13 may be eliminated by dividing the desired threshold value $T_5$ by 2. In some examples, this may be desirable, as one multiplication operation is reduced during computation. The applications of Equation 13 in the decision logic 312 is identical to the discussion above in relation to Equation 9, 10, and 11.

Gesture Prediction:

In some examples, it may be desirable to predict a gesture based on a change in the orientation between a first orientation and a second orientation. For example, a first predetermined orientation may correspond to the hand (or host device) being down, as described with reference to Equation 13. Next, a second predetermined orientation may correspond to the hand (host device) held in a position conducive to reading a display of the host device, for example, reading a watch. The second predetermined orientation may be determined as described with reference to Equation 9, Equation 10 and Equation 11.

In some examples, before a second signal is generated when the orientation of the host device corresponds to the second predetermined orientation, it may be desirable to confirm the host device was previously in the first predetermined orientation. In other words, change in the orientation of the host device from a first predetermined orientation to a second predetermined orientation may indicate a gesture. In some examples, based on the change in the orientation, a gesture is predicted, for example, the hand which was down is now up. The verification of the gesture may take place in the decision logic 312, which will use the appropriated quaternion components and thresholds to determine the first orientation and the second orientation. The decision logic 312 will also apply the required time characteristics, for example the device has to be in the first orientation and the second orientation for predetermined amounts of time.

In the equations above, the quaternion components are compared to threshold. The underlying principle can be compared to the projection of the axes of the stationary frame onto the axis of the device frame. For example, consider Equation 9 and FIG. 4A. Assuming unit vectors for the axes, FIG. 4A shows that the sine of angle φ actual represents the projection of the Z1 axes onto the XA axes, where the projection increases as the angle increases. In a similar manner, the sine of angle α and the cosine of angle θ represent the projection of the Z1 axis on the YA axis and ZA axis, respectively. The equations above represent the principle of setting threshold ranges for the projections of Z1 axis on the different axes of the device frame. The method of using the quaternion components as demonstrated above may be replaced by similar methods to determine the projections. For example, when rotation matrices are used with conventional notations, the elements of the last row correspond to the different axes projections discussed above.

Now, referring to FIG. 4E-4H, the orientation determination explained with reference to Equation 9, Equation 10 and Equation 11 is shown pictorially with respect to a sphere 450. The host device 100 is depicted in the center of the sphere with the stationary axis X1 and Y1 shown. The figure also shows the ZA axis perpendicular to the display surface. The points on the surface of the sphere 450 represent the end of the ZA vector. This means that if ZA is a unit vector, the sphere will have a radius of 1. Each different orientation of the device corresponds to a different point on the sphere. Therefore, the orientation conditions represented above by the different equations may be interpreted as different sections of the (area of the) sphere that the vector ZA may point at.

Figure 4E:
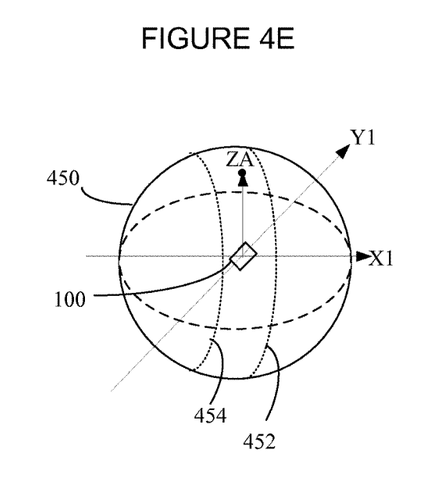
FIGS. 4E-4H show orientation determination of the host device of FIG. 4, according to one aspect of the present disclosure.

FIG. 4E corresponds to Equation 9, where the XA axis was at an angle with the X1 axis (FIG. 4A). The threshold values T1 corresponds to the host device 100 oriented within the band represented by lines 452 and 454 within the sphere 450. In other words, the condition of Equation 9 can be represented by a vertical band running over the surface of the sphere, where the width of the band is determined by threshold T1. When the vector ZA points to within this band, Equation 9 is fulfilled.

Figure 4F:
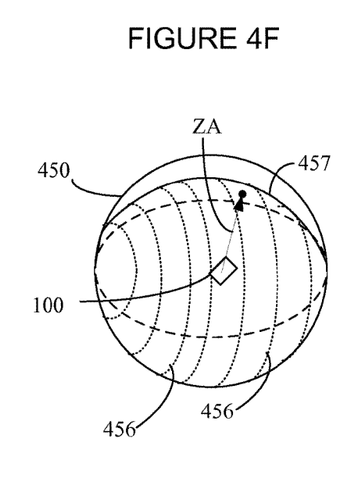

FIG. 4F corresponds to Equation 10, wherein the host device 100 is oriented corresponding to the surface of the sphere facing out of the figures, as shown by the dotted lines 456. The top of the area (defined by line 457) corresponds to the threshold T2 that dictates that the YA axis should have a minimum positive angle with the Y1 axis.

Figure 4G:
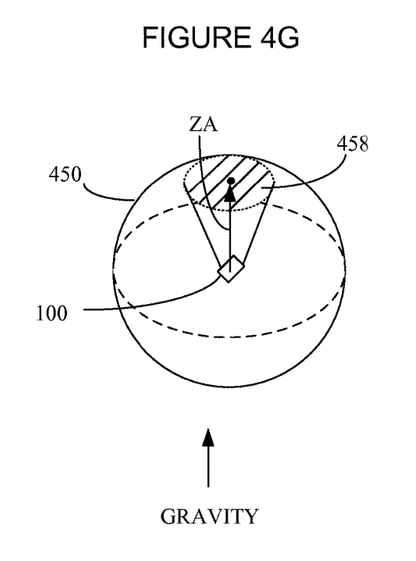
Figure 4H:
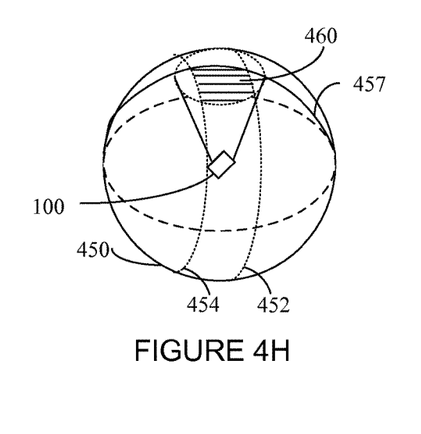

FIG. 4G corresponds to Equation 11, wherein the host device 100 is oriented corresponding to the marked region 458. The marked region 458 corresponds to the axis ZA describing a cone around axis Z1, where the cone angle depends on threshold. FIG. 4H shows the host device 100 meeting all the threshold requirements of Equation 9, Equation 10 and Equation 11, shown by the hatched lines 460 within the band represented by lines 452 and 454.

The lines that form that boundaries of the areas on the sphere (e.g. 452, 454, 456, . . . ) correspond to the defined threshold values ($T_1$, $T_2$, . . . ). This concept may be inversed so that the boundaries may be defined in order to set the threshold values. In other words, areas on the sphere are first defined from which the thresholds for the quaternion components may be derived. For this purpose, the sphere surface may be divided into segments, and the axis ZA must point to within predefined segments. The definition of the predefined segments is then similar to setting the thresholds on the quaternions elements (or on the projections). When considering gestures, a first area may be defined that corresponds to the first orientation, and a second area may be defined that corresponds to the second orientation.

In the discussions above it was considered that the user was in a normal upright position, and that therefore the ideal position to look at a device like e.g. a watch would be facing the user, meaning the display facing up and angled somewhat towards the user. If the user is in a different position, the thresholds may need to be altered. In other words, the thresholds are position and activity dependent. For example, if the user is watching TV in a couch up position, the watch may have to be rotated more down for the user to look at the display. In one example, the decision logic 312 may also include a module that determines the position and/or the activity of the user, and adjusts the threshold values accordingly, for example, using a look up table that stores the position and/or activities and corresponding threshold values. The activity information may come from the device itself, or from another device that is capable of monitoring the activity and/or position of the user.

In the stationary frame, the Z1 axis can be thought of as corresponding to the orientation of the head of the user. To compensate for the activity and/or position of the user, we can also modify the reference frame to correspond to the actual position of the user's head. Consider that the orientation of the head with respect to the stationary frame can be expressed as a quaternion $Q_H$, then the quaternion of the device orientation can be corrected using the standard quaternion reference frame conversion using $Q_H$. The extra rotation by $Q_H$ then compensates for the orientation of the head of the user.

The threshold values may be adapted or changed to adjust to the gesture or habits of the user. For example, consider the band 452 of FIG. 4E. If the gestures of the user fall repeatedly close to the limit of the band, the threshold $T_1$ may be adjusted to widen the band to avoid that the device does not corresponds correctly, i.e. activates the display, when a gestures of the user lands just outside the band, but the user intended to look at the display. On the other hand, if the user repeatedly stays within a very small center portion of the band because his or her gestures are very precise, the threshold may be adapted to narrow the band. This would not influence the performance of the activation of the display, but saves more energy. The center of the band (or area) may be determined by an averaging of the user's gestures.

The threshold values may also be adjusted depending on the available energy or the battery status. For example, at a full battery status the threshold may correspond to large areas in FIGS. 4D-4H. In other words, the display may be activated over a large range. However, when the battery is low, say at or below a battery charge threshold value defining a battery low, the threshold values may be adjusted to correspond to small areas. This means the display is activated within a limited orientation range in order to save battery power.

In some examples, the activation of the display may be performed gradually, for example varying the display intensity. The intensity may be at its maximum at the center of the area, and may decrease close to the edges of the area. This provides visual feedback to the user, and it is especially helpful for small or narrow area, for example, as discussed above when the user makes accurate gestures repeatedly or when the battery is low.

Figure 5:
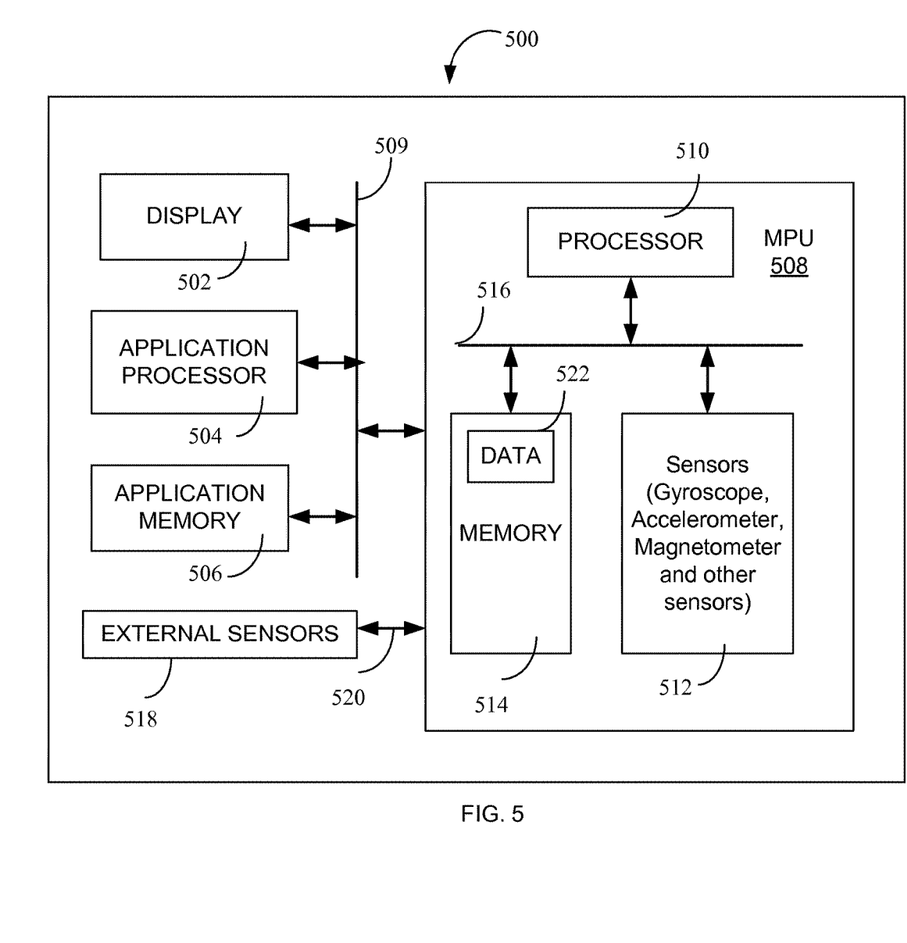
FIG. 5 shows an example host device, according to one aspect of the present disclosure.

Now, referring to FIG. 5, an example host device 500 is described. Host device 500 may be similar to host device 100 as described with reference to FIG. 1. The host device 500 includes a display 502, an application processor 504, application memory 506 and a motion processing unit 508 (sometimes referred to as MPU), all communicating over a host bus 509. In some examples, application processor 504 may include a device clock generator. In some examples, device clock generator may be independent of the application processor 504 and coupled to the host bus 509 so as to provide device clock signals to various components of the host device 500.

MPU 508 includes a processor 510, one or more sensors 512, a memory 514, all communicating with each other over a MPU bus 516. One or more external sensors 518 may communicate with the MPU 508 over link 520. Data 522 portion of memory 514 may be used to store permanent and transient values generated during the operation of the MPU 508. For example, information related to sensors, orientation information, signals generated during the operation, time stamps of various operations performed and the like may be stored in the data 522 portion of memory 514. In some examples, the MPU 508 may be separate from the host device 500, but coupled over a link to communicate with the host device 500.

In some examples, MPU 508 may implement one or more functional modules described with reference to system 300. For example, sensors 302a, 302b and 302c of system 300 may correspond to sensors 512. In some examples, one or more sensors 302a, 302b and 302c may correspond to external sensors 518. In some examples, orientation module 306 and decision logic 312 may be implemented in the MPU 508. As one skilled in the art appreciates, these functional modules may be implemented as a hardware, software or a combination of hardware and software modules.

In some examples, one or more of these functional modules may be implemented as software functions stored in the memory 514, which are executed by the processor 510. In some examples, some of these functional modules may be implemented as software functions stored in the application memory 506, which are executed by the application processor 504. Results of these functions may be reported back to the MPU 508.

In one example, the MPU 508 is configured to communicate information related to orientation of the host device 500 to the application processor 504, over bus 509. The information related to orientation of the host device may be stored in the application memory 506. The stored information related to orientation may be used by one or more applications running on the host device to manipulate or change information displayed on the display 502. In some examples, the information related to orientation may indicate a gesture, based upon a change in the information related to orientation over time.

In some examples, the MPU 508 may raise an interrupt or other signal to the application processor 504, for example, over bus 509 to indicate availability of orientation information related to the host device. In some examples, the application processor 504 may be in a sleep or hibernation mode to minimize the power consumption of the host device and the interrupt signal awakes the application processor 504 to an active state. In some examples, the interrupt may signal the activation or deactivation of the display.

Figure 6:
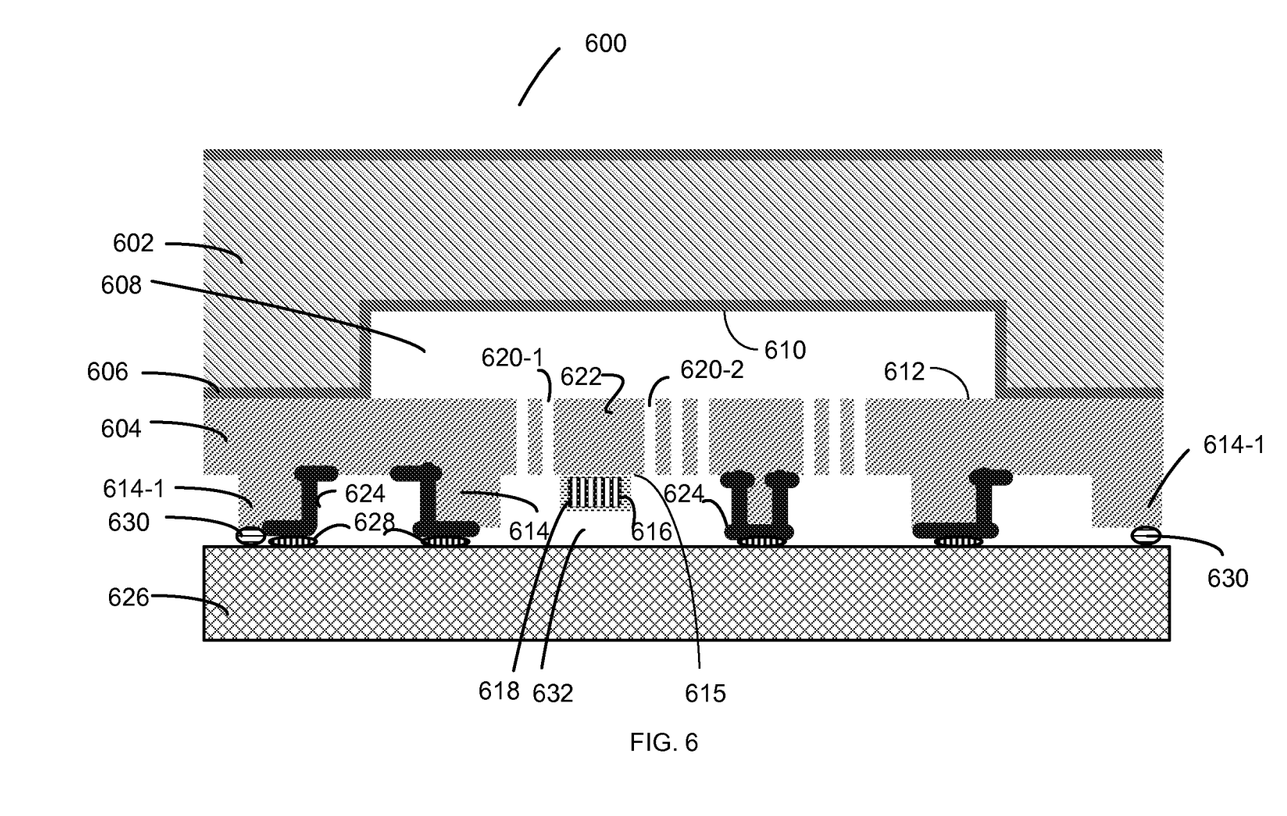
FIG. 6 shows an example MEMS device, according to one aspect of the present disclosure.

Now, referring to FIG. 6, an example MEMS device 600 is described. In some examples, MEMS device 600 may correspond to the MPU 508 described with reference to FIG. 5. Substrate 600 includes a handle layer 602 and a device layer 604. One or more sensors are formed on the device layer 604. An example magnetic sensor will be described with reference to the MEMS device 600. Magnetic sensor may be configured as a compass. As one skilled in the art appreciates, in a similar manner other or additional sensors may be formed on the device layer, for example, an accelerometer and/or a gyroscope.

A fusion bond layer 606 bonds the handle layer 602 to device layer 604, to form an upper cavity 608, defined by the lower side 610 of the handle layer 602 and upper side 612 of the device layer 604. Now referring to device layer 604, a plurality of standoff 614 structures are formed on the device layer 604, for example, by deep reactive ion etching (DRIE) process. Magnetic films are deposited, patterned and magnetized on the lower side 615 of the device layer 604, to form a first permanent magnet 616. The first permanent magnet 616 is oriented in a predefined direction by applying an external magnetic field.

In some embodiments, a protective layer 618 is deposited over the first permanent magnet 616, to prevent oxidization of the first permanent magnet 616.

FIG. 6 also shows trench patterns 620-1 and 620-2, an actuator 622, device pads 624, integrated circuit substrate 626, IC pads 628 and seal ring 630. A movable actuator 622 is created by forming a plurality of trench patterns 620-1 and 620-2 on the device layer 604, for example, using a DRIE process. First permanent magnet 616 is located on the first actuator 622. Next, device pads 624, preferably made of germanium alloys are deposited and patterned on the device layer 604.

Integrated circuit substrate 626 includes one or more electronic circuits that communicate with various sensors formed on the device layer 604. IC pads 628, preferably made of aluminum alloys are deposited and patterned on the integrated circuit substrate 626. IC pads 628 are coupled to device pads 624 to provide a communication path to various sensors formed on the device layer 604. For example, device pads 624 may be eutectic bonded with IC pads 628. As previously described with reference to FIG. 5 one or more components of MPU 508 for example, processor 510, memory 514 and MPU bus 516 may also be provided or fabricated on the integrated circuit substrate 526.

Standoff 614-1 surrounds various devices formed on the device layer 604. A seal ring 630 is formed on the standoff 614-1 to bond the device layer 604 with integrated circuit substrate 626, for example, to hermetically seal various devices formed on the device layer 604. Height of the standoff 614-1, along with seal ring 630 define height of the lower cavity 632.

Figure 7:
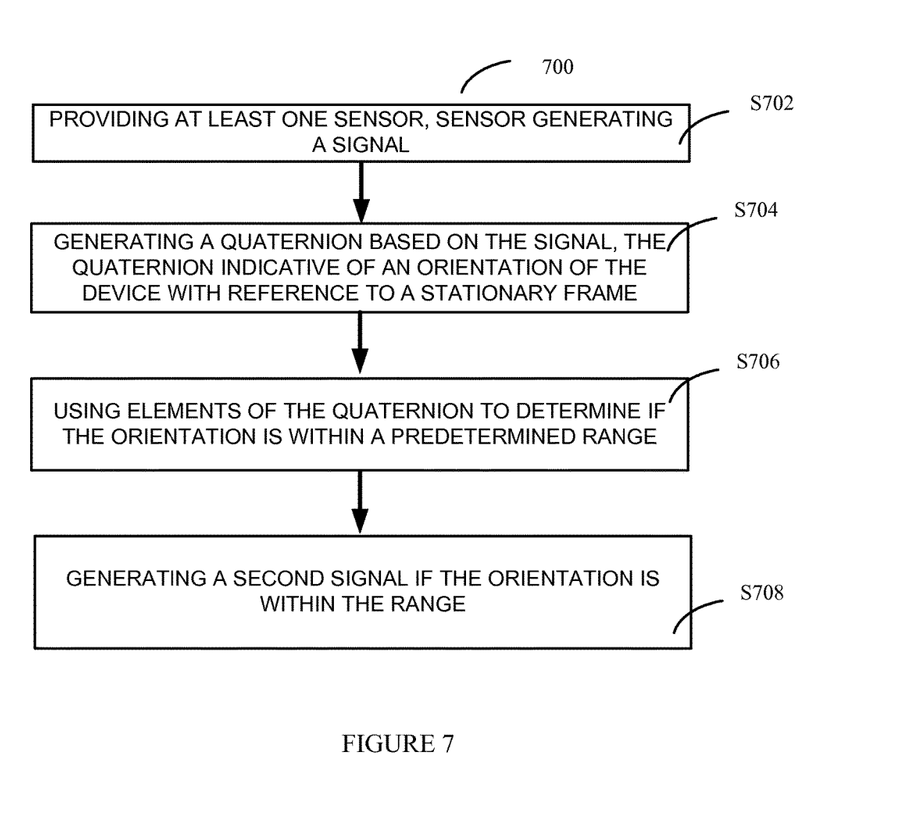
FIG. 7 shows a flow diagram to determine orientation of a host device, according to one aspect of the present disclosure.

Now, referring to FIG. 7, an example flow diagram 700 will be described. In block S702, at least one sensor is provided, sensor generating a signal. For example, one or more of sensors 302a, 302b and 302c are provided. The sensor generates a signal indicative of the orientation of the device.

In block S704, a quaternion is generated based on the signal. The quaternion is indicative of an orientation of the device with reference to a stationary frame. For example, the signal from the sensor is processed by the orientation module 306 to generate a quaternion indicative of the orientation of the device with reference to a stationary frame.

In block S706, the elements of the quaternion are used to determine if the orientation is within a predetermined range. For example, requirements of Equations 9, Equation 10 and Equation 11 are compared to a predetermined range, for example, predetermined threshold values.

In block S708, a second signal is generated if the orientation is within the predetermined range. For example, if the requirements of Equations 9, Equation 10 and Equation 11 are within the predetermined range, for example, predetermined threshold values, a second signal may be generated to indicate that the orientation of the host device corresponds to a desired orientation. The signal may be used, for example, to activate the display of the host device.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method for determining orientation of a device, comprising:
providing at least one sensor, said sensor generating a signal;
generating a quaternion based on the signal, said quaternion indicative of an orientation of the device with reference to a stationary frame, the quaternion having a plurality of elements generally represented as $q_w$, $q_x$, $q_y$, and $q_z$, wherein for an angle $\theta$ rotated about a unit vector $[u_x, u_y, u_z]$, $q_w$ is equal to $\cos(\theta/2)$, $q_x$ is equal to $\sin(\theta/2)$ times $u_x$, $q_y$ is equal to $\sin(\theta/2)$ times $u_y$, and $q_z$ is equal to $\sin(\theta/2)$ times $u_z$;
defining a desired range of orientations for the device, with at least one threshold value defining the desired range of orientations for the device;
determining if the orientation of the device is within the desired range of orientations by comparing one or more of the elements of the generated quaternion indicative of the orientation of the device to the at least one threshold value defining the desired range of orientations, wherein comparing includes performing multiplication of at least two selected elements of the generated quaternion generally represented as $q_w$, $q_x$, $q_y$, and $q_z$; and
generating a second signal when the comparison performed based on the multiplication of the at least two selected elements of the generated quaternion is within the at least one threshold value defining the desired range of orientations, the second signal indicative of the orientation of the device within the desired range of orientations.

2. The method of claim 1, further including defining a first desired range of orientations and a second desired range of orientations, wherein comparing further including:
verifying an indicated orientation has changed from the first desired range of orientations to the second desired range of orientations; and
predicting a gesture based on the change in the orientation.

3. The method of claim 2, wherein the second signal is indicative of the predicted gesture.

4. The method of claim 1, wherein the sensor may be one of a gyroscope, an accelerometer and a magnetometer.

5. The method of claim 4, wherein the device includes a plurality of sensors and the plurality of sensors may be at least two of a gyroscope, an accelerometer and a magnetometer.

6. The method of claim 5, wherein output from at least two sensors are combined to generate a combined signal indicative of an orientation represented as a quaternion.

7. The method of claim 1, wherein the at least one threshold value depends on an activity of a user of the device.

8. The method of claim 1, wherein the at least one threshold value depends on a previous orientation of the device.

9. The method of claim 1, wherein based on a status of a battery of the device, the desired range of orientations for the device is changed by changing the threshold value.

10. The method of claim 1, wherein the second signal is used to selectively control a display of the device.

11. The method of claim 10, wherein the second signal is used to selectively switch the display between an active state and an inactive state.

12. The method of claim 10, wherein the second signal is used to selectively adjust an intensity of the display based on the position of the device within the desired range of orientations.

13. The method of claim 12, wherein the desired range of orientations defines an area and the intensity of the display is substantially maximum when the position of the device is about a center of the area.

14. The method of claim 13, wherein the intensity of the display is reduced when the position of the device is away from the center of the area.

15. The method of claim 1, wherein the desired range of orientations including at least a first range of orientations and a second range of orientations, a first threshold value defining the first range of orientations and a second threshold value defining the second range of orientations,
comparing elements of the generated quaternion indicative of the orientation of the device to the first threshold value to determine if the orientation is within the first range of orientations;
comparing elements of the generated quaternion indicative of the orientation of the device to the second threshold value to determine if the orientation of the device is within the second range of orientations; and based on the comparison, generating the second signal when the orientation of the device is in both the first range of orientations and the second range of orientations.

16. A system to determine orientation of a device, comprising:
- at least one sensor, a signal generated by the at least one sensor;
- a quaternion is generated based on the signal, said generated quaternion indicative of an orientation of the device with reference to a stationary frame, the generated quaternion having a plurality of elements generally represented as $q_w$, $q_x$, $q_y$, and $q_z$, wherein for an angle $\theta$ rotated about a unit vector $[u_x, u_y, u_z]$, $q_w$ is equal to $\cos(\theta/2)$, $q_x$ is equal to $\sin(\theta 2)$ times $u_x$, $q_y$ is equal to $\sin(\theta/2)$ times $u_y$, and $q_z$ is equal to $\sin(\theta/2)$ times $u_z$;
- a desired range of orientations for the device are defined, with at least one threshold value defines the desired range of orientations for the device;
- one or more elements of the generated quaternion indicative of the orientation of the device are compared to the at least one threshold value defining the desired range of orientations to determine if the orientation of the device is within the desired range of orientation, wherein multiplication of at least two selected elements of the generated quaternion generally represented as $q_w$, $q_x$, $q_y$, and $q_z$ is performed to compare the elements of the quaternion to the at least one threshold value; and
- a second signal is generated, if the comparison performed based on the multiplication of the at least two selected elements of the generated quaternion is within the at least one threshold value defining the desired range of orientations, the second signal indicative of the orientation of the device within the desired range of orientations.

17. The system of claim 16, further includes a first desired range of orientations and a second desired range of orientations; and
- a decision logic to
    verify the indicated orientation has changed from the first desired range of orientations to the second desired range of orientations; and
    predict a gesture based on the change in the orientation.

18. The system of claim 16, wherein the sensor may be one of a gyroscope, an accelerometer and a magnetometer.

19. The system of claim 18, wherein the device includes a plurality of sensors and the plurality of sensors may be at least two of a gyroscope, an accelerometer and a magnetometer.

20. The system of claim 19, wherein output from at least two sensors are combined to generate a combined signal indicative of an orientation represented as a quaternion.

21. The system of claim 16, wherein the at least one threshold value depends on an activity of a user of the device.

22. The system of claim 16, wherein the at least one threshold value depends on a previous orientation of the device.

23. The system of claim 16, wherein based on a status of a battery of the device, the desired range of orientations is changed by changing the threshold value.

24. The system of claim 16, wherein the second signal is used to selectively control a display of the device.

25. The system of claim 24, wherein the second signal is used to selectively switch the display between an active state and an inactive state.

26. The system of claim 24, wherein the second signal is used to selectively adjust an intensity of the display based on the position of the device within the desired range of orientations.

27. The system of claim 26, wherein the desired range of orientations defines an area and the intensity of the display is substantially maximum when the position of the device is about a center of the area.

28. The system of claim 27, wherein the intensity of the display is reduced when the position of the device is away from the center of the area.

29. The system of claim 16, wherein the second signal is indicative of the predicted gesture.

30. The system of claim 16, wherein the desired range of orientations including at least a first range of orientations and a second range of orientations, a first threshold value defining the first range of orientations and a second threshold value defining the second range of orientations,
- elements of the generated quaternion indicative of the orientation of the device is compared to the first threshold value to determine if the orientation is within the first range of orientations;
- comparing elements of the generated quaternion indicative of the orientation of the device to the second threshold value to determine if the orientation of the device is within the second range of orientations; and
- the second signal is generated when the comparison of the orientation of the device is in both the first range of orientations and the second range of orientations.

* * * * *